US007109100B2

(12) United States Patent
Nakamura (10) Patent No.: US 7,109,100 B2
(45) Date of Patent: Sep. 19, 2006

(54) SEMICONDUCTOR DEVICE AND METHOD FOR MANUFACTURING SEMICONDUCTOR DEVICE

(75) Inventor: Mitsuhiro Nakamura, Kanagawa (JP)

(73) Assignee: Sony Corporation, (JP)

( * ) Notice: Subject to any disclaimer, the term of this patent is extended or adjusted under 35 U.S.C. 154(b) by 179 days.

(21) Appl. No.: 10/494,620

(22) PCT Filed: Aug. 29, 2003

(86) PCT No.: PCT/JP03/11015

§ 371 (c)(1),
(2), (4) Date: May 4, 2004

(87) PCT Pub. No.: WO2004/023544

PCT Pub. Date: Mar. 18, 2004

(65) Prior Publication Data

US 2004/0266090 A1 Dec. 30, 2004

(30) Foreign Application Priority Data

Sep. 5, 2002 (JP) ............................. 2002-260245

(51) Int. Cl.
*H01L 21/22* (2006.01)
*H01L 21/38* (2006.01)
(52) U.S. Cl. .................... 438/559; 438/510; 438/514; 438/542; 438/561
(58) Field of Classification Search ................ 438/185, 438/561, 559
See application file for complete search history.

(56) References Cited

U.S. PATENT DOCUMENTS

| | | | | |
|---|---|---|---|---|
| 4,502,898 A | * | 3/1985 | Camlibel et al. ........... 438/558 |
| 4,843,033 A | * | 6/1989 | Plumton et al. ............ 438/186 |
| 5,188,978 A | * | 2/1993 | deSouza et al. ............ 438/181 |
| 5,243,207 A | * | 9/1993 | Plumton et al. ............ 257/192 |
| 5,254,863 A | * | 10/1993 | Battersby .................... 257/191 |
| 5,350,709 A | * | 9/1994 | Harada et al. .............. 438/181 |
| 5,430,310 A | * | 7/1995 | Shibasaki et al. ........... 257/190 |
| 5,445,979 A | * | 8/1995 | Hirano ....................... 438/167 |

(Continued)

FOREIGN PATENT DOCUMENTS

JP 51-83772 A 7/1976

(Continued)

OTHER PUBLICATIONS

Sawada et al. "A new two-mode channel fet (TMT) for super-low-noise and high-power applications" IEEE Electron device letters vol. 14 No. 7 Jul. 1993 p. 354-356.*

(Continued)

*Primary Examiner*—B. William Baumeister
*Assistant Examiner*—Granvill D Lee, Jr.
(74) *Attorney, Agent, or Firm*—Rader, Fishman & Grauer PLLC; Ronald P. Kananen (57) ABSTRACT

To provide a semiconductor device able to be made uniform in diffusion depth of the impurity in a diffusion layer by a single diffusion and to give the desired threshold voltage and improved in yield and a method of producing the same. The device has a channel layer 16 formed on a substrate 12, a diffusion stop layer 17 formed on the top surface of the channel layer 16, a diffusion layer 18 formed on the top surface of the diffusion stop layer, and a doping region 25 formed adjoining the diffusion stop layer 17 at least at part of the diffusion layer 18 and having an impurity diffused in it, the diffusion stop layer 17 having a slower diffusion rate of the impurity than the diffusion rate of the diffusion layer 18 and stopping diffusion of the impurity from the diffusion layer 18.

18 Claims, 11 Drawing Sheets

U.S. PATENT DOCUMENTS

| | | | |
|---|---|---|---|
| 5,650,642 A * | 7/1997 | Sawada et al. | 257/192 |
| 5,751,027 A * | 5/1998 | Sawada et al. | 257/192 |
| 5,872,031 A * | 2/1999 | Mishra et al. | 438/216 |
| 6,096,587 A * | 8/2000 | Imoto et al. | 438/191 |
| 6,429,103 B1 * | 8/2002 | Johnson et al. | 438/518 |
| 6,448,119 B1 * | 9/2002 | Onda | 438/172 |
| 6,583,485 B1 * | 6/2003 | Epke | 257/484 |
| 6,605,831 B1 * | 8/2003 | Inai et al. | 257/194 |
| 6,867,078 B1 * | 3/2005 | Green et al. | 438/167 |
| 2001/0013604 A1 * | 8/2001 | Hase | 257/12 |
| 2002/0003245 A1 * | 1/2002 | Kato et al. | 257/279 |
| 2003/0010999 A1 * | 1/2003 | Tanabe | 257/194 |
| 2003/0030053 A1 * | 2/2003 | Kawakami et al. | 257/72 |

FOREIGN PATENT DOCUMENTS

| | | | |
|---|---|---|---|
| JP | 60-077418 | | 5/1985 |
| JP | 63-020878 A | | 1/1988 |
| JP | 04-364027 | * | 12/1992 |
| JP | 2001-244456 | * | 9/2001 |
| JP | 2001-244456 A | | 9/2001 |

OTHER PUBLICATIONS

International Search Report dated Feb. 12, 2003.

* cited by examiner

SEMICONDUCTOR DEVICE AND METHOD FOR MANUFACTURING SEMICONDUCTOR DEVICE

TECHNICAL FIELD

The present invention relates to a semiconductor device in which impurities are diffused to a diffusion layer to form a gate and a method of producing a semiconductor device.

BACKGROUND ART

Recently, in mobile communication systems, there has been a strong demand for making mobile communication terminals smaller in size and lower in power consumption. To realize these requirements, for example, the transmission power amplifier has to be able to run on a single positive power supply, to be able to be driven by a lower voltage, and to have a higher drive efficiency. As devices currently in use for such power amplifiers, a junction type field effect transistor (JFET) a heterojunction type FET (HFET), a Schottky barrier gate field effect transistor (metal semiconductor field effect transistor: MESFET), a heterojunction type FET using a p-type gate (p-type gate HFET), etc. can be mentioned.

Among these, a p-type gate HFET has a p-n junction at the gate and thus can accept a high voltage applied to the gate. Therefore, the p-type gate HFET is operable by the single positive power supply. Further, since it has a hetero structure, it is a device showing an excellent linearity characteristic. Moreover, the threshold voltage of the FET is determined by the Al or In contents of the layers formed by epitaxial growth, the thicknesses of the layers, the carrier concentrations, and other factors determined at the time of epitaxial growth and by the diffusion depth of the P-type gate.

Generally, for mass production, device manufacturers often purchase epitaxial substrates produced by other manufacturers for producing epitaxial substrates and process the epitaxial substrates to form transistors. On the other hand, when producing p-type gate HFETs, in the epitaxial substrate manufacturers, GaAs, AlGaAs, InGaAs, and other epitaxial layers are formed on GaAs or other substrates. However, these layers generally suffer from variance in content of Al or In, variance in carrier concentration, and variance in thickness. Control of the thicknesses or carrier concentrations of the layers included in such epitaxial substrates was difficult for the device manufacturers.

Figure 1:
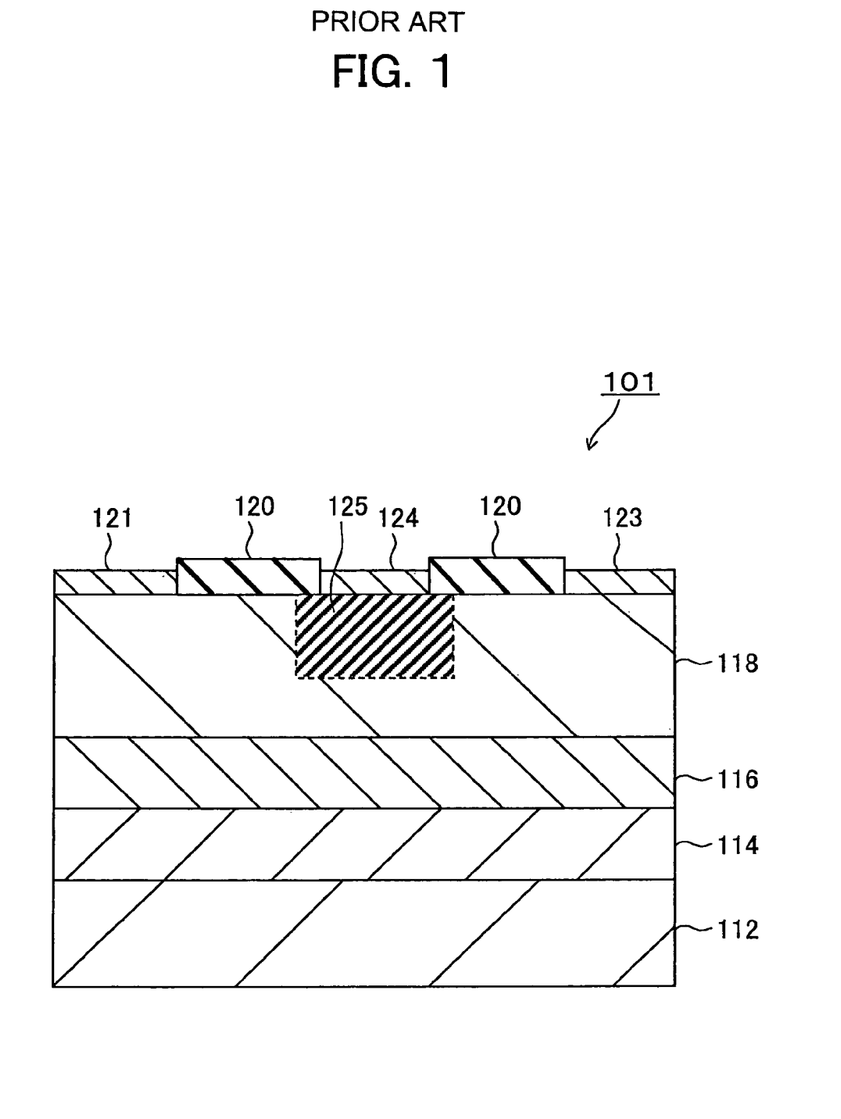
FIG. 1 is a cross-sectional view of an example of the configuration of a conventional semiconductor device.

FIG. 1 is a cross-sectional view of an example of the configuration of a conventional semiconductor device.

A GaAs substrate 112 serving as a semiconductor substrate is formed with a buffer layer 114, the buffer layer 114 is formed on its top surface with a channel layer 116 forming a channel of a transistor, and the channel layer 116 is formed on its top surface with an AlGaAs layer 118 as a diffusion layer. The AlGaAs layer 118 is formed with a SiN film 120 as an insulating film. Moreover, the AlGaAs layer 118 is formed with a gate electrode 124, a source electrode 121, and a drain electrode 123 insulated by the SiN film 120. The AlGaAs layer 118 of the diffusion layer formed under the gate electrode 124 is formed with a doping region 125 by selective diffusion of, for example, a p-type impurity Zn as a carrier, whereby the semiconductor device 101 is formed.

As the method of producing a conventional semiconductor device, for example, Japanese Unexamined Patent Publication (Kokai) No. 2001-188077 discloses diffusing a p-type impurity Zn in GaAs or AlGaAs by measuring the electrical characteristics after diffusion, calculating a diffusion coefficient from the characteristics, calculating the amount of diffusion to obtain the desired threshold voltage, raising the temperature of the wafer again to diffuse the impurity based on the results of calculation, and measuring the electrical characteristics after cooling the wafer to thereby control the diffusion depth.

Figure 2:
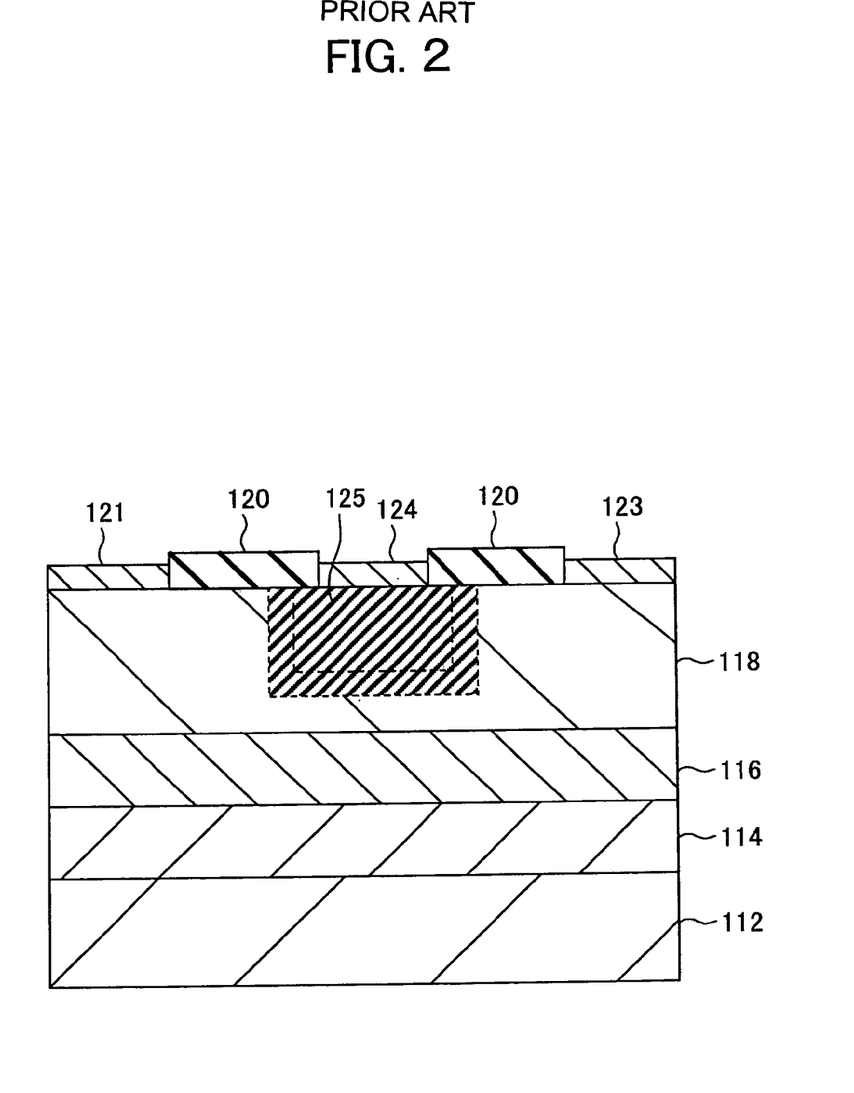
FIG. 2 is a cross-sectional view of an example of the configuration of a conventional semiconductor device.

However, the diffusion depth changes along with a change of the diffusion time, temperature or the gas flow rate, so it was not possible to focus the characteristics of semiconductor devices formed in the same substrate. Here, "focus" means, for example, to make the threshold voltage of semiconductor devices the desired value. In other words, the method of producing the conventional semiconductor device 101 suffered from the problem that when doping the p-type impurity to form the doping region 125, as shown in FIG. 2, control of the doping region 125 was difficult. Therefore, an IC (integrated circuit) produced from the center part of a wafer and an IC produced from the circumference sometimes had different threshold voltages. As a result, the threshold voltages of the semiconductor devices 101 produced from one wafer did not become uniform. Due to this, of course, some devices could not be used as ICs and the yield declined. In addition, there were the problems that the wafer temperature rose, time was required for cooling, and the TAT (turn around time) of the process was long. Therefore, a semiconductor device able to maintain the characteristics of the semiconductor device and able to be given the desired threshold voltage by a single diffusion and a method of producing the same have been desired.

DISCLOSURE OF THE INVENTION

The present invention was made in consideration of the above situation and has as its object to provide a semiconductor device given a uniform diffusion depth of impurities of a doping region formed in a diffusion layer by a single diffusion to obtain the desired threshold voltage and improved in yield and a method of producing the semiconductor device.

To achieve the above object, the semiconductor device of the present invention has a channel layer formed on a substrate, a diffusion stop layer formed on the top surface of the channel layer, a diffusion layer formed on the top surface of the diffusion stop layer, and a doping region formed adjoining the diffusion stop layer at least at a part of the diffusion layer and having an impurity diffused in its. The diffusion stop layer has a diffusion rate slower than the diffusion rate of the impurity in the diffusion layer and stops the diffusion of the impurity from the diffusion layer.

According to the semiconductor device of the present invention, the diffusion layer is formed by a layer with a faster diffusion rate of the impurity than the diffusion stop layer. The diffusion stop layer under it is formed by a layer with a slower diffusion rate of the impurity than the diffusion layer. Therefore, the diffusion appears to be fast in the diffusion layer and the diffusion appears to rapidly stop in the diffusion stop layer. Consequently, the diffusion depth of the impurity in the doping region is controlled to be uniform, and the semiconductor device can be given a uniform threshold voltage.

To achieve the above object, a method of producing a semiconductor device of the present invention has the steps of forming a channel layer on a substrate; forming a diffusion stop layer above the channel layer; forming a diffusion layer above the diffusion stop layer; and forming a doping region doped with an impurity so as to adjoin the diffusion stop layer at least at a part of the diffusion layer. In the step of forming the diffusion stop layer, the diffusion stop layer is formed using a material having a diffusion rate of the impurity slower than the diffusion layer. In the step of forming the doping region, the diffusion of the impurity is stopped by the diffusion stop layer.

According to the method of producing a semiconductor device of the present invention, since the diffusion layer has a diffusion rate of the impurity faster than the lower diffusion stop layer, in the diffusion layer, the impurity appears to rapidly stop in the diffusion stop layer with the slower diffusion. Therefore, the diffusion depth of the impurity in the doping region is controlled to be uniform, and the semiconductor device can be produced given a uniform threshold voltage.

BEST MODE FOR CARRYING OUT THE INVENTION

Preferred embodiments of the present invention will be described next with reference to the drawings.

Note that the embodiments explained below are preferable specific examples of the present invention, so are given various preferable technical limitations, but the scope of the present invention is not limited to these embodiments in so far as there is no description in the following explanation to the effect of limiting the invention.

<First Embodiment>

Figure 3:
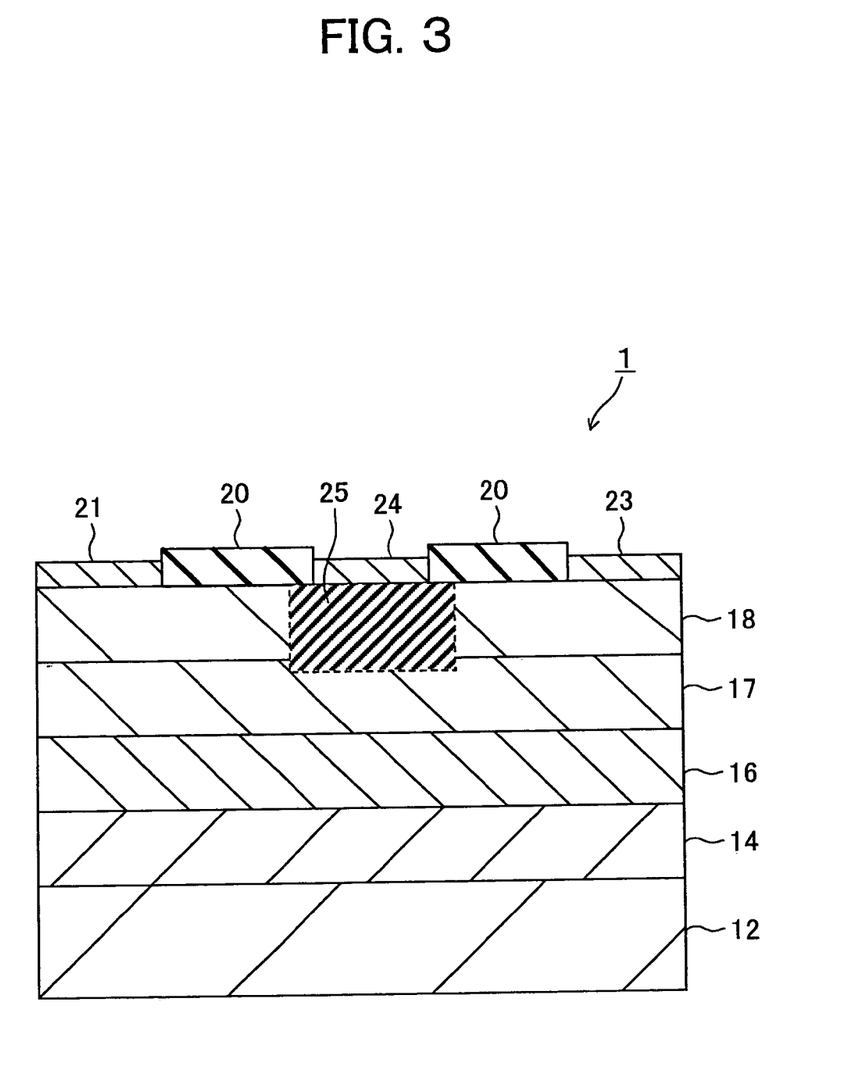
FIG. 3 is a cross-sectional view of an example of the configuration of a semiconductor device according to a first embodiment.

FIG. 3 is a cross-sectional view of an example of the configuration of a semiconductor device 1 according to a first embodiment of the present invention. Note that the illustrated layers are made substantially equal thicknesses for facilitating viewing, but the invention is not limited to such a ratio of thicknesses of the layers.

The semiconductor device 1 is formed by a semiconductor substrate of, for example, the GaAs substrate 12 on which a buffer layer 14 and a channel layer 16 for forming a channel of a transistor are formed.

The channel layer 16 has formed over it a GaAs layer 17 as the diffusion stop layer characterizing the present embodiment. Details of the GaAs layer 17 will be explained later. The GaAs layer 17 has a diffusion layer 18 stacked over it. The diffusion layer 18 is easily diffused with a carrier of, for example, the p-type impurity Zn. The impurity is selectively diffused up to a predetermined diffusion depth.

The diffusion layer 18 is formed by, for example, an InGaP layer instead of an AlGaAs layer like in the prior art. The InGaP layer 18 has formed above it with a SiN film 20 as an insulating film. Moreover, the InGaP layer 18 has formed above it a gate electrode 24, a source electrode 21, and a drain electrode 23 insulated by the SiN film 20. The InGaP layer 18 of the diffusion layer formed below the gate electrode 24 has a carrier, that is, for example, a p-type impurity Zn, selectively diffused in it to form a doping region 25 and thereby form a gate.

Here, the GaAs layer 17 has a slower diffusion rate of the impurity compared with the InGaP layer 18 formed above it. Therefore, when the impurity selectively diffused in the InGaP layer 18 reached the GaAs layer 17 of the diffusion stop layer, the diffusion was rapidly suppressed. In other words, the GaAs layer 17 can suppress the diffusion of the impurity from the InGaP layer 18. As a result, the depth to which the impurity is diffused is accurately controlled. If the diffusion depth of the impurity is accurately controlled in this way, the threshold voltage of the p-type gate FET (field effect transistor) including these gates 24 can be accurately controlled.

The semiconductor device 1 is configured as explained above. Next, an example of the method of producing a semiconductor device will be explained with reference to FIG. 3.

FIG. 4 to FIG. 7 are cross-sectional views of an example of the procedure of the method of producing a semiconductor device according to the present embodiment. Here, the steps of producing a p-type gate FET (field effect transistor) will be described.

Figure 4:
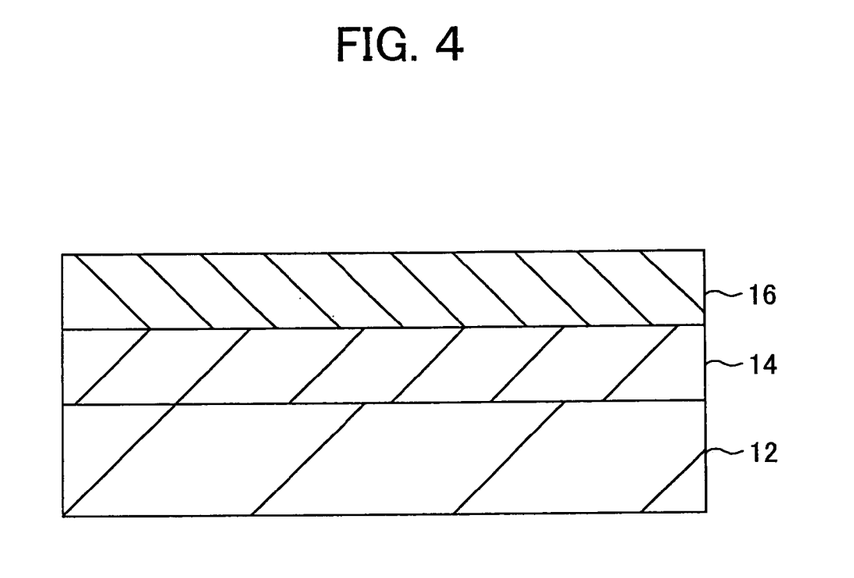
FIG. 4 is a cross-sectional view of an example of the procedure of a method of producing the semiconductor device according to the first embodiment.

First, as shown in FIG. 4, for example, the GaAs substrate 12 is formed with a buffer layer 14 of a GaAs layer, while the buffer layer 14 is formed with a channel layer 16 for forming a channel. The buffer layer 14 and the channel layer 16 are formed by epitaxial growth, etc.

Figure 5:
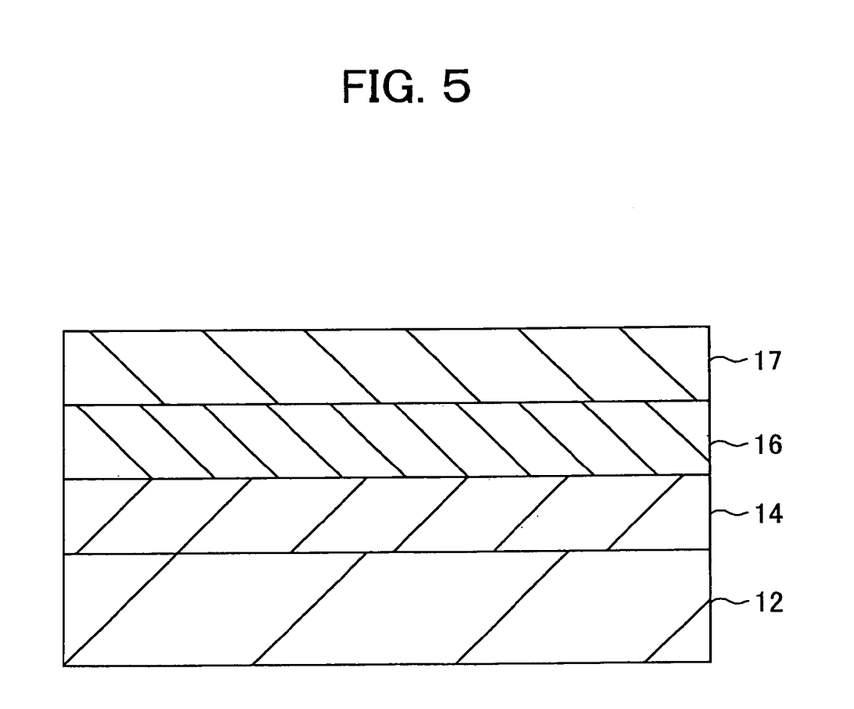
FIG. 5 is a cross-sectional view of an example of the procedure of a method of producing the semiconductor device according to the first embodiment.

Next, as shown in FIG. 5, the channel layer 16 is formed on its top surface with a GaAs layer 17 as the diffusion stop layer characterizing the present embodiment by epitaxial growth, etc.

Figure 6:
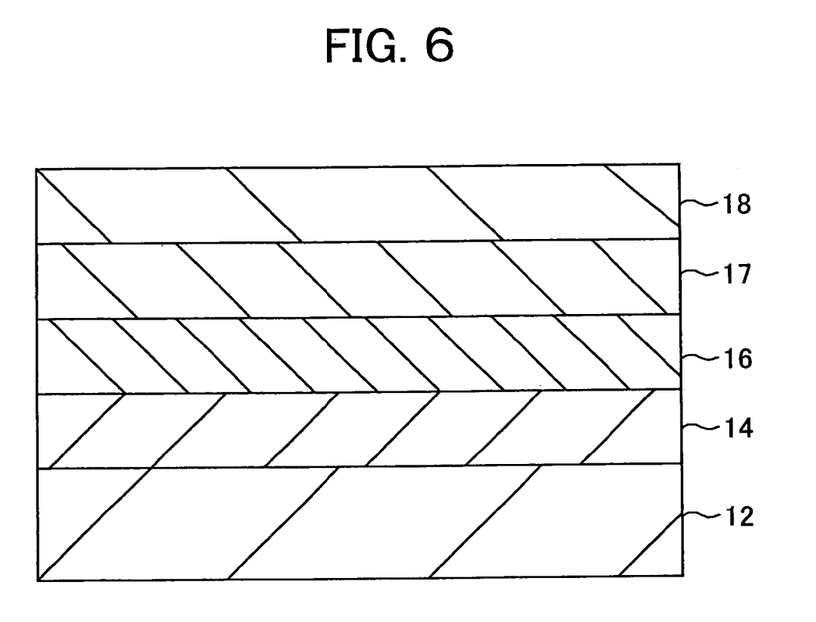
FIG. 6 is a cross-sectional view of an example of the procedure of a method of producing the semiconductor device according to the first embodiment.

Moreover, as shown in FIG. 6, the GaAs layer 17 is formed on its top surface with an InGaP layer 18 as an example of the diffusion layer (doped layer of carrier) with a faster diffusion rate of the impurity compared with the GaAs layer by epitaxial growth, etc. Next, the InGaP layer 18 has a SiN film 20 for forming a selective diffusion mask deposited on its top surface.

Figure 7:
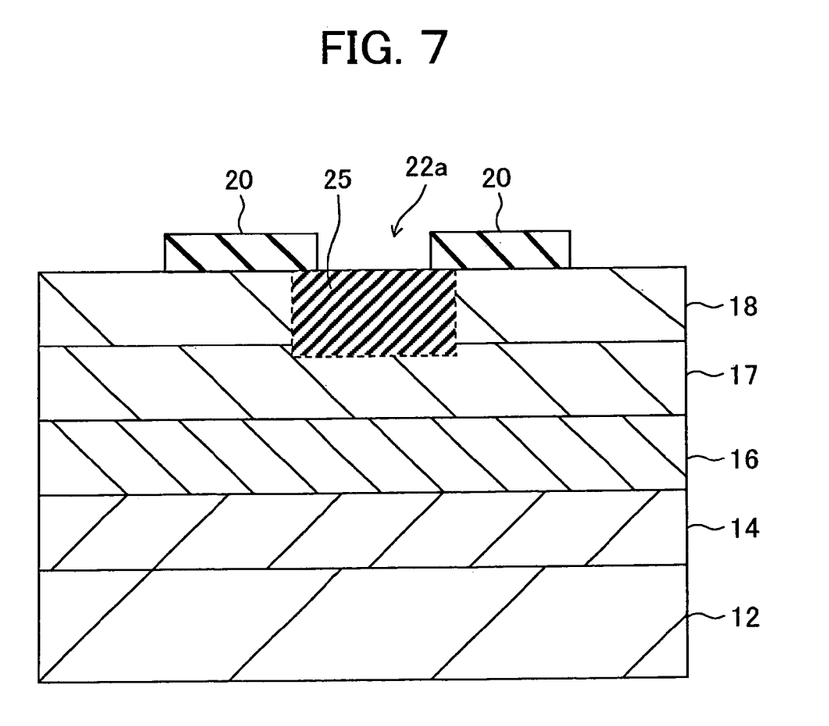
FIG. 7 is a cross-sectional view of an example of the procedure of a method of producing the semiconductor device according to the first embodiment.

Then, as shown in FIG. 7, the SiN film 20 is formed with an aperture 22a corresponding to the gate, etc. of the field effect transistor (FET).

The top surface of the InGaAs layer 18 exposed by the aperture 22a has, for example, the p-type impurity Zn selectively diffused in it at a temperature of about 600° C. to form a doping region 25 and thereby form a gate structure. Here, the p-type impurity diffuses in the InGaP layer 18. The diffusion stops in the GaAs layer 17 of the diffusion stop layer with the slower diffusion rate than the InGaP layer 18. Therefore, the diffusion of the impurity appears to be fast in the InGaP layer 18 of the diffusion layer and the diffusion appears to stop rapidly in the GaAs layer 17 of the lower diffusion stop layer. As a result, the semiconductor device 1 can be controlled to a uniform diffusion depth of the impurity in the doping region 25 with a single diffusion and, for example, can be given a uniform threshold voltage both when produced from the center part of the same wafer and when produced at the circumference.

Further, in other words, in the GaAs layer 17 of the diffusion stop layer, the concentration of the impurity declines the further from the InGaP layer 18 of the diffusion layer. Therefore, the semiconductor device 1 can be controlled to a uniform diffusion depth of the impurity in the doping region 25 formed at the InGaP layer 18 of the diffusion layer and be given a uniform threshold voltage.

Finally, the InGaP layer 18 is exposed by the aperture 22a that is formed on it, as shown in FIG. 3, with a gate electrode 24, etc. and with a p-type gate FET.

Figure 8:
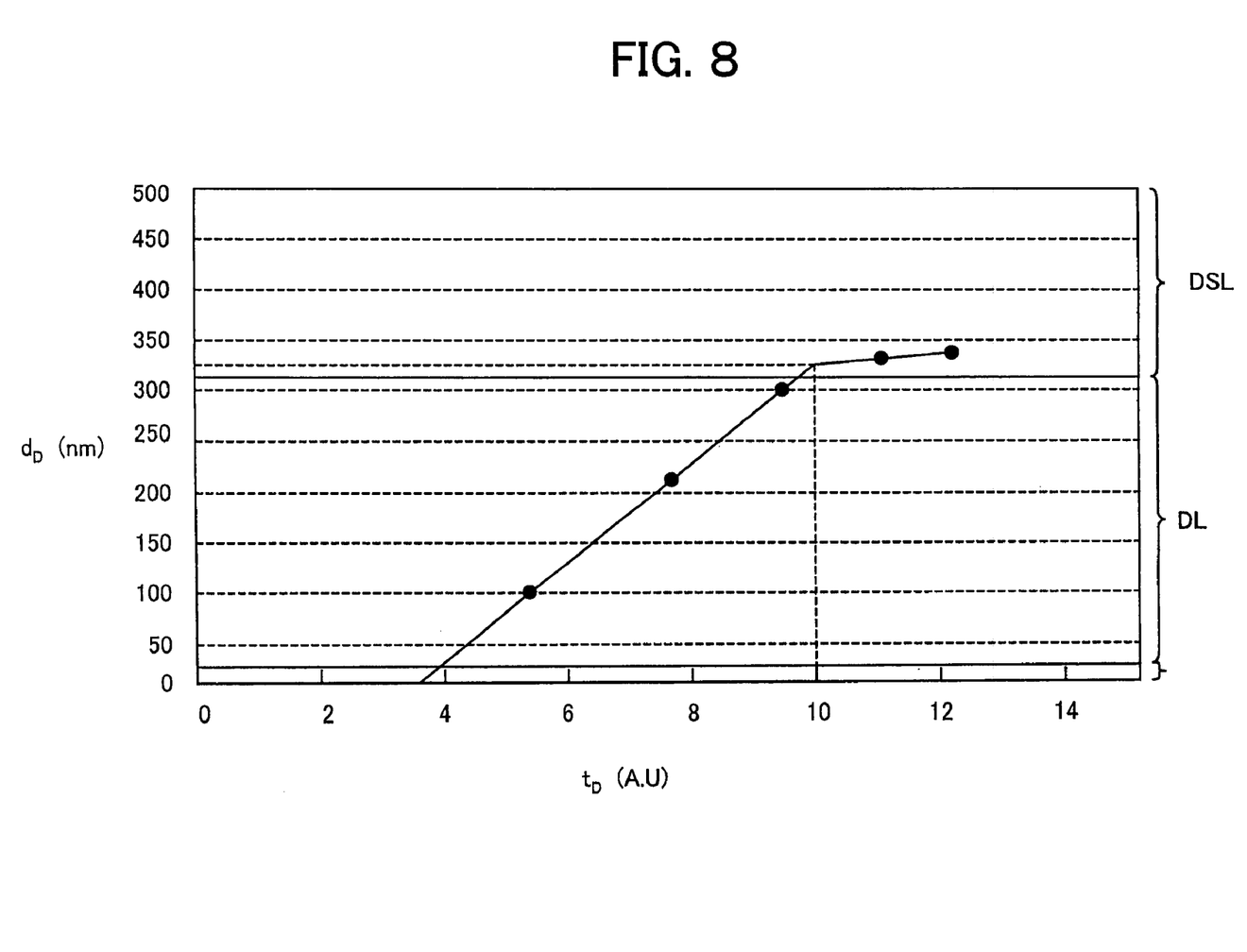
FIG. 8 is a view of an example of the characteristic of the diffusion depth and the diffusion time.

FIG. 8 is a view of an example of the characteristic of the diffusion depth and the diffusion time. In FIG. 8, the GaAs layer 17 of the diffusion stop layer DSL is formed to, for example, about 200 nm, while the InGaP layer 18 of the diffusion layer DL is formed to, for example, about 300 nm. The abscissa shows the diffusion time $t_D$, while the ordinate shows the thickness $d_D$.

According to the above characteristic, for example, up to the diffusion time 10[A.U], the impurity diffuses deeply in the InGaP layer 18 of the diffusion layer DL. At around the diffusion time 10[A.U], it reaches the GaAs layer 17 of the diffusion stop layer DSL. However, it will be understood that even if the impurity is diffused for a long time of for example over the diffusion time 10[A.U], the depth to which the impurity is diffused in the diffusion stop layer does not become deep. Therefore, according to the above method of producing a semiconductor device 1, it is possible to more accurately control the diffusion depth than in the past. As a result, semiconductor devices 1 produced by the above method become uniform in threshold voltage and improved in yield. Here, the diffusion impurity of Zn has a possibility to get to a channel layer in a range of very low concentration, order of less than $10^{16}$ cm$^{-3}$. And the thickness of the diffusion stop layer is determined by threshold voltage.

In the present embodiment, the diffusion stop layer 17 is formed by a layer with a slower diffusion of the impurity than the diffusion layer 18 and has a concentration of the impurity which gradually falls the further from the diffusion layer 18 side. Therefore, the semiconductor device 1 according to the present invention is controlled to a uniform diffusion depth of the impurity in the doping region 25 formed in the diffusion layer 18 and can be given a uniform threshold voltage.

Further, by using Zn as the impurity and using a GaAs layer as the diffusion stop layer 17, the diffusion of Zn as an impurity from the diffusion layer 18 becomes slow and diffusion becomes difficult.

According to the present embodiment, it is possible to achieve a uniform diffusion depth of the impurity in the InGaP layer 18 of the diffusion layer by a single diffusion, obtain the desired threshold voltage, and improve the yield.

<Second Embodiment>

Figure 9:
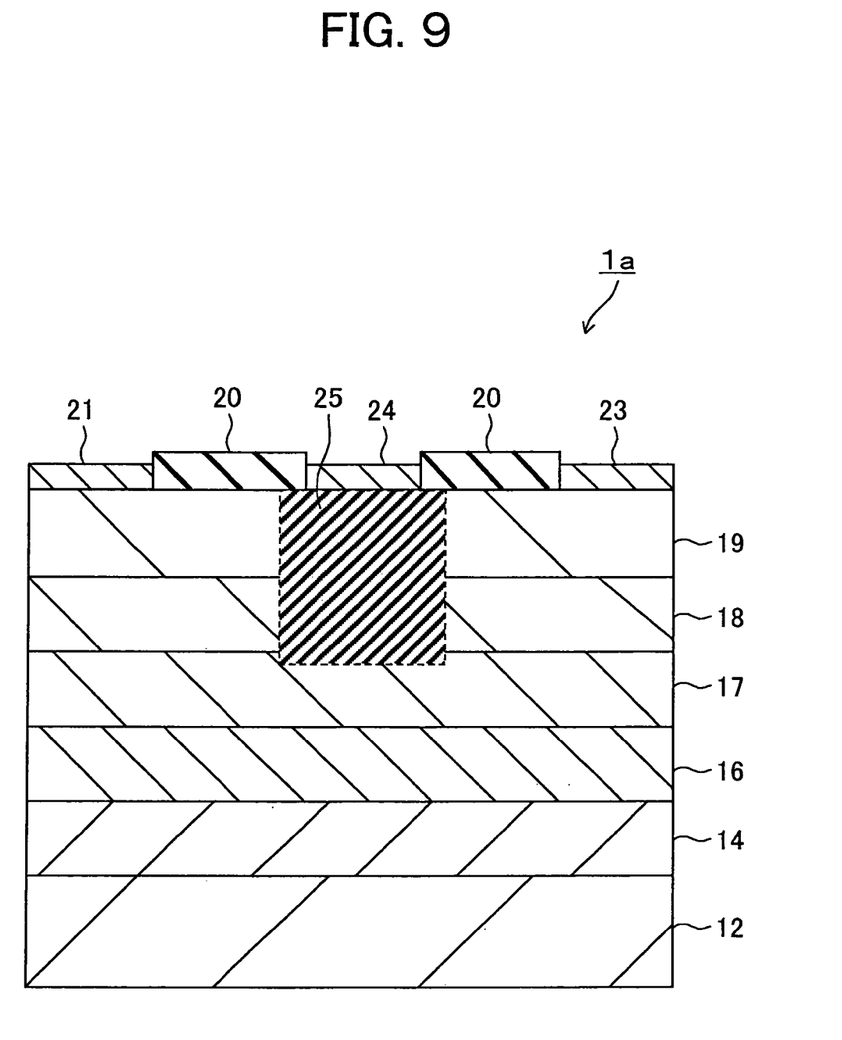
FIG. 9 is a cross-sectional view of an example of the configuration of a semiconductor device according to a second embodiment.

FIG. 9 is a cross-sectional view of an example of the configuration of a semiconductor device 1a according to a second embodiment.

The semiconductor device 1a according to the present embodiment is configured in substantially the same way as the semiconductor device 1 according to the first embodiment shown in FIG. 3, so the same structures are assigned notations common with FIG. 3 and explanations are omitted. The explanation will be made focusing on the points of difference.

Further, the method of producing a semiconductor device according to the present embodiment is substantially the same in procedure as the method of producing a semiconductor device according to the first embodiment shown in FIG. 4 to FIG. 7, so the same procedures are assigned notations common with FIG. 4 to FIG. 7 and explanations are omitted. The explanation will be made focusing on the points of difference.

The semiconductor device 1a according to the present embodiment has a GaAs substrate 12 on which a buffer layer 14 and a channel layer 16 for forming a channel of a transistor are formed. The channel layer 16 is formed with a GaAs layer 17 as a diffusion stop layer, while the GaAs layer 17 has a diffusion layer 18 stacked over it. The InGaP layer 18 is formed with an AlGaAs layer 19 as an evaporation prevention layer, while the AlGaAs layer 19 is formed with a SiN film 20 as an insulating film. Moreover, the AlGaAs layer 19 is formed with a gate electrode 24, a source electrode 21, and a drain electrode 23 insulated by the SiN film 20. The AlGaAs layer 19 of the evaporation prevention layer and the InGaP layer 18 of the diffusion layer formed under the gate electrode 24 have a carrier, for example, the p-type impurity Zn, selectively diffused in them to form the doping region 25 to thereby form the gate.

The semiconductor device 1a differs from the semiconductor device 1 according to the first embodiment in that, for example, a GaAs layer 19 of the evaporation prevention layer is provided between the InGaP layer 18, and the gate electrode 24, etc. and SiN film 20. Note that, for example, the evaporation prevention layer may be an AlGaAs layer. The evaporation prevention layer can prevent evaporation of the elements contained in the diffusion layer due to the heating steps of producing the semiconductor device. Due to this, the relationship of the rates of diffusion of the impurity at the diffusion layer and the diffusion stop layer can be maintained.

The semiconductor device 1a is configured in this way. Next, an example of the method of producing a semiconductor device 1a will be explained.

Figure 10:
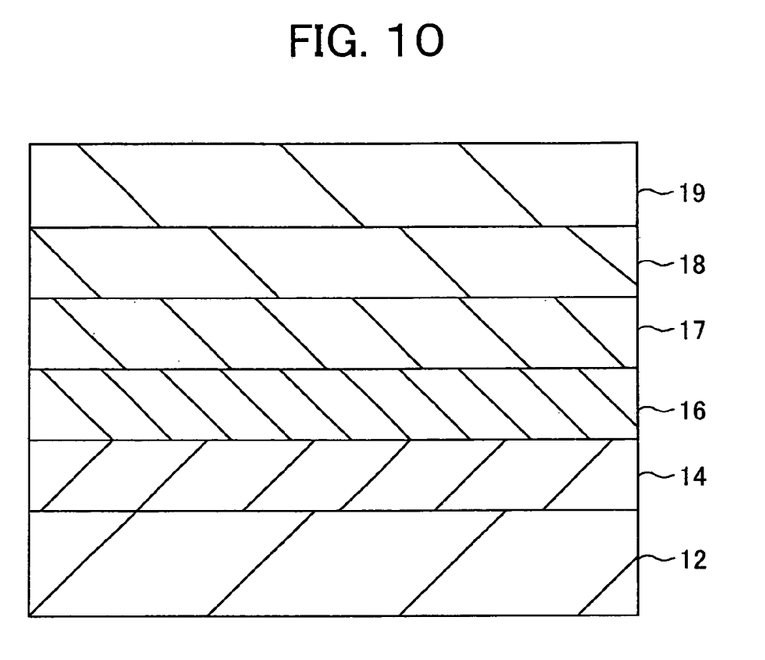
FIG. 10 is a cross-sectional view of an example of the procedure of a method of producing the semiconductor device according to the second embodiment.
Figure 11:
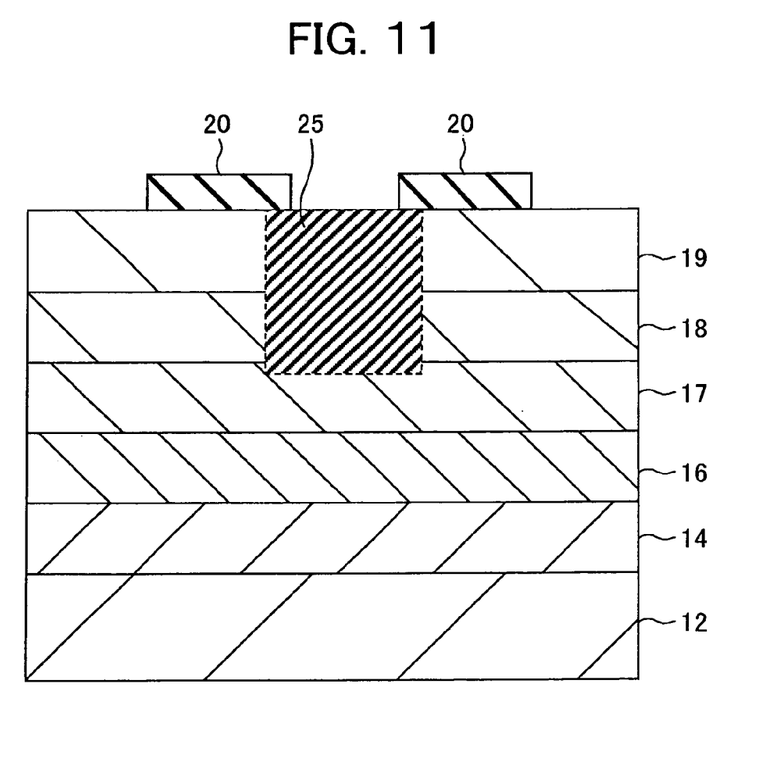
FIG. 11 is a cross-sectional view of an example of the procedure of a method of producing the semiconductor device according to the second embodiment.

FIG. 10 and FIG. 11 are cross-sectional views of an example of the procedure of the method of producing a semiconductor device according to the present embodiment. Note that the method of producing the semiconductor device according to the present embodiment is the same as the method of producing the semiconductor device according to the first embodiment up to FIG. 4 to FIG. 6, so, mainly, only the points of difference will be described.

For example, a GaAs substrate 12 is formed with a buffer layer 14 of a GaAs layer, and the buffer layer 14 is formed with a channel layer 16 for forming a channel. Next, the channel layer 16 is formed with a GaAs layer 17 as the diffusion stop layer. Next, the GaAs layer 17 is formed with an InGaP layer 18 as a diffusion layer with a faster diffusion rate of the impurity compared with the GaAs layer. The buffer layer 14, the channel layer 16, the diffusion stop layer 17, and the diffusion layer 18 are formed by, for example, epitaxial growth.

After forming the InGaP layer 18 by epitaxial growth, as shown in FIG. 10, the InGaP layer 18 of the diffusion layer is formed with a GaAs layer 19 of the evaporation prevention layer by epitaxial growth. Next, a similar method as in FIG. 7 is used to form a SiN film 20 on the GaAs layer 19 of the evaporation prevention layer.

Next, as shown in FIG. 11, the SiN film 20 is used as a mask for selective diffusion of, for example, the p-type impurity Zn in the GaAs layer 19 of the evaporation prevention layer and the InGaP layer 18 of the diffusion stop layer at a temperature of about 600° C.

At that time, the impurity is diffused from the InGaP layer 18. When reaching the GaAs layer 17 of the diffusion stop layer, diffusion of the impurity rapidly stops. Therefore, the InGaP layer 18, etc. is formed with the doping region 25 shown in FIG. 11. Then, in the same way as the first embodiment, the GaAs layer 19 of the evaporation prevention layer is formed with a gate electrode 24, etc.

In the semiconductor device according to the present embodiment, for example, by forming the diffusion stop layer 17 by a layer including an AlGaAs layer and using Zn as the impurity, it is possible to improve the withstand voltage effect compared with the case of making the diffusion stop layer 17, for example, a GaAs layer.

Further, the evaporation prevention layer 19 can prevent evaporation of the elements contained in the diffusion layer 18 at the time of heating when producing a semiconductor device. Therefore, the semiconductor device has a uniform threshold voltage. For example, it is possible to use a GaAs layer as the evaporation prevention layer 19 to prevent evaporation of elements of the diffusion layer 18 and make the threshold voltage uniform. Moreover, it is possible to use an AlGaAs layer as the evaporation prevention layer 19. By using an AlGaAs layer as the evaporation prevention layer 19, it is possible to improve the withstand voltage effect compared with when making the evaporation prevention layer 19, for example, a GaAs layer.

According to the present embodiment, it is possible to exhibit substantially the same effects as the first embodiment. In addition, the GaAs layer 19 of the evaporation prevention layer can prevent evaporation of the elements contained in the diffusion layer, for example, the P in the InGaP layer 18, when heating during the production of the semiconductor device 1a. Therefore, the semiconductor device 1a has a uniform threshold voltage and is improved in yield.

<Third Embodiment>

Figure 12:
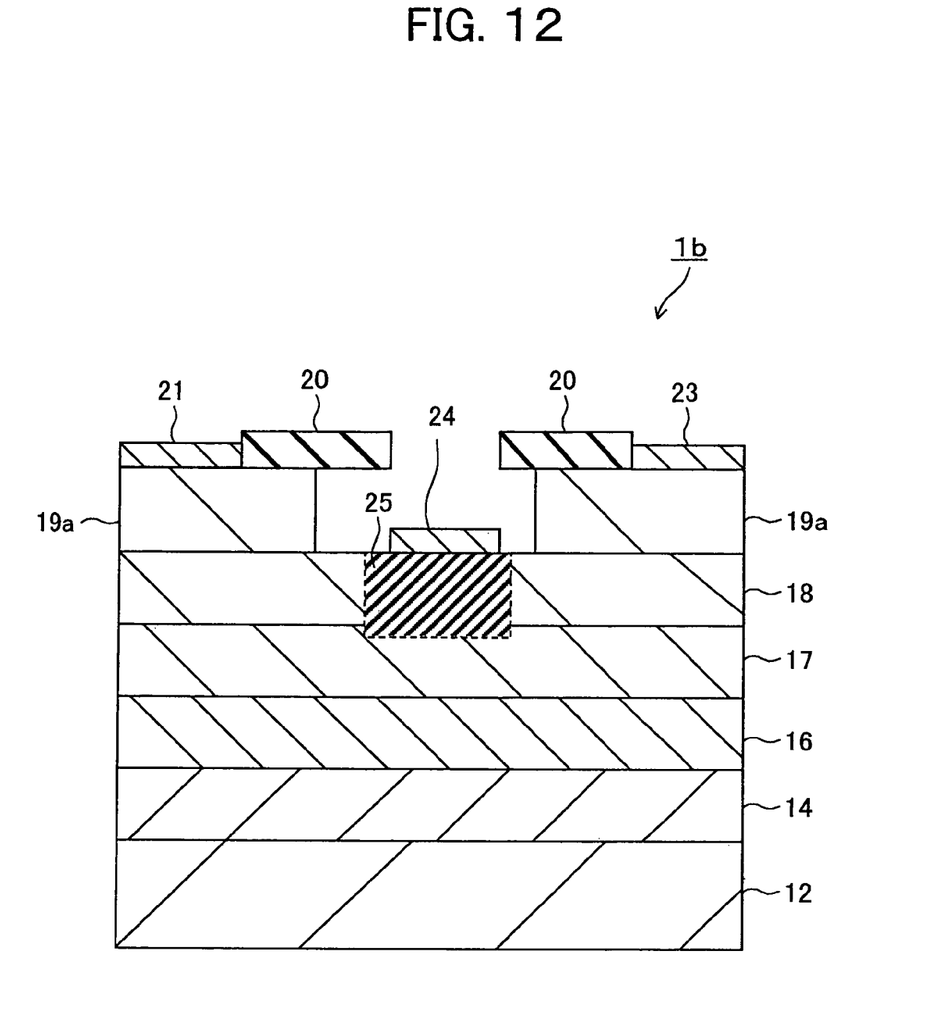
FIG. 12 is a cross-sectional view of an example of the configuration of a semiconductor device according to a third embodiment.

FIG. 12 is a cross-sectional view of an example of the configuration of a semiconductor device 1b according to a third embodiment of the present invention.

The semiconductor device 1b is configured substantially the same as the semiconductor device 1 according to the first embodiment shown in FIG. 3, so the same structures are assigned notations common with FIG. 3 and explanations thereof are omitted. Mainly, the points of difference will be explained. Further, the method of producing a semiconductor device according to the present embodiment is substantially the same in procedure as the method of producing a semiconductor device according to the first embodiment shown in FIG. 4 to FIG. 7, so the procedures the same as those in the first embodiment are assigned notations common with FIG. 4 to FIG. 7 and explanations thereof are omitted. Mainly, the points of difference will mainly be explained.

The semiconductor device 1b according to the present embodiment has a GaAs substrate 12 on which a buffer layer 14 and a channel layer 16 forming a channel of a transistor are formed. The channel layer 16 has a GaAs layer 17 stacked on it. The GaAs layer 17 is formed with an InGaP layer 18 of the diffusion layer. The InGaP layer 18 is formed with an n-type GaAs layer 19a. The n-type GaAs layer 19a is formed with an aperture, by which at least part of the InGaP layer 18 is exposed. The exposed InGaP layer 18 is formed with a doping region 25. The doping region 25 is formed with a gate electrode 24 and formed with a gate structure. Further, the n-type GaAs layer 19a is formed with a SiN film 20 as an insulating film and is formed with a source electrode 21 and a drain electrode 23 insulated by the SiN film 20.

In the semiconductor device 1b, unlike the semiconductor device 1 according to the first embodiment, for example, a GaAs layer 19a (n-type GaAs layer) is provided between the InGaP layer 18 and the gate electrode 24, etc. and SiN film 20. Further, the gate electrode 24 is provided in the aperture formed in the GaAs layer 19a.

Next, an example of the method of producing a semiconductor device 1b will be explained.

Figure 13:
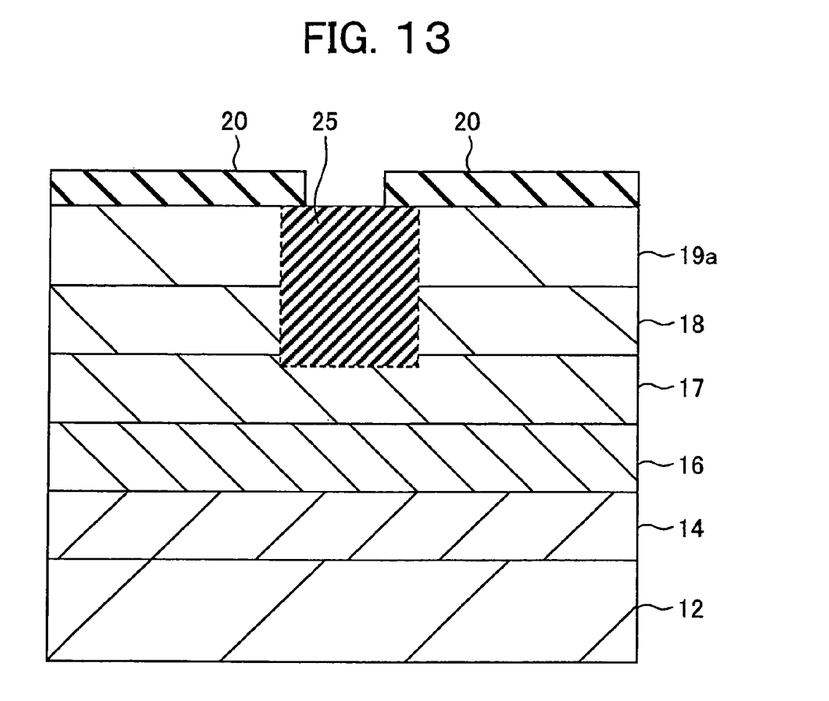
FIG. 13 is a cross-sectional view of an example of the procedure of a method of producing the semiconductor device according to the third embodiment.
Figure 14:
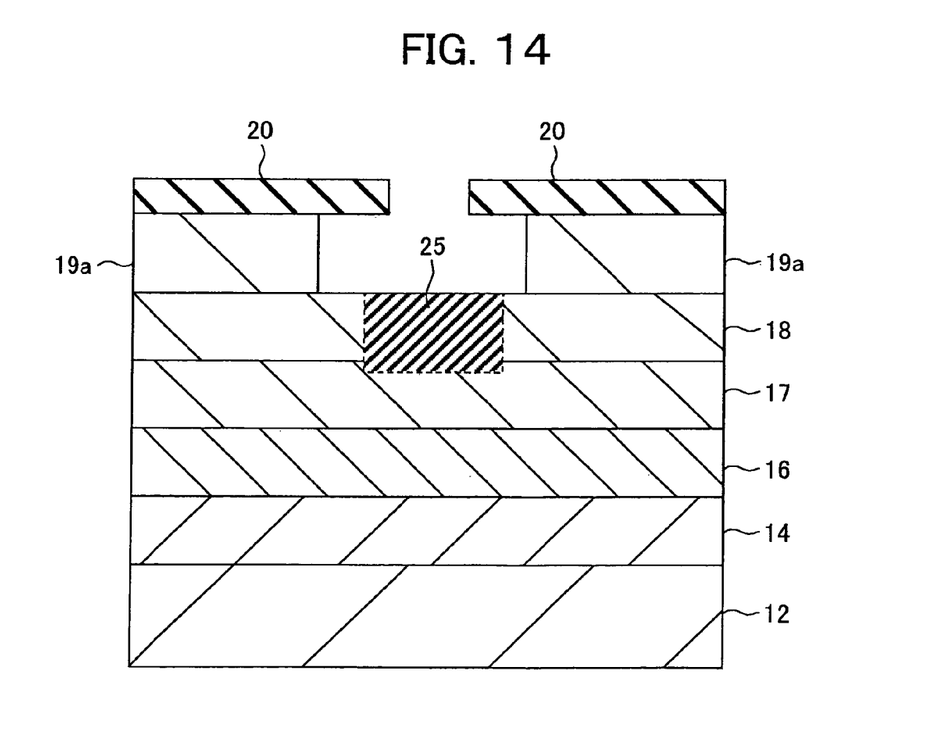
FIG. 14 is a cross-sectional view of an example of the procedure of a method of producing the semiconductor device according to the third embodiment.
Figure 15:
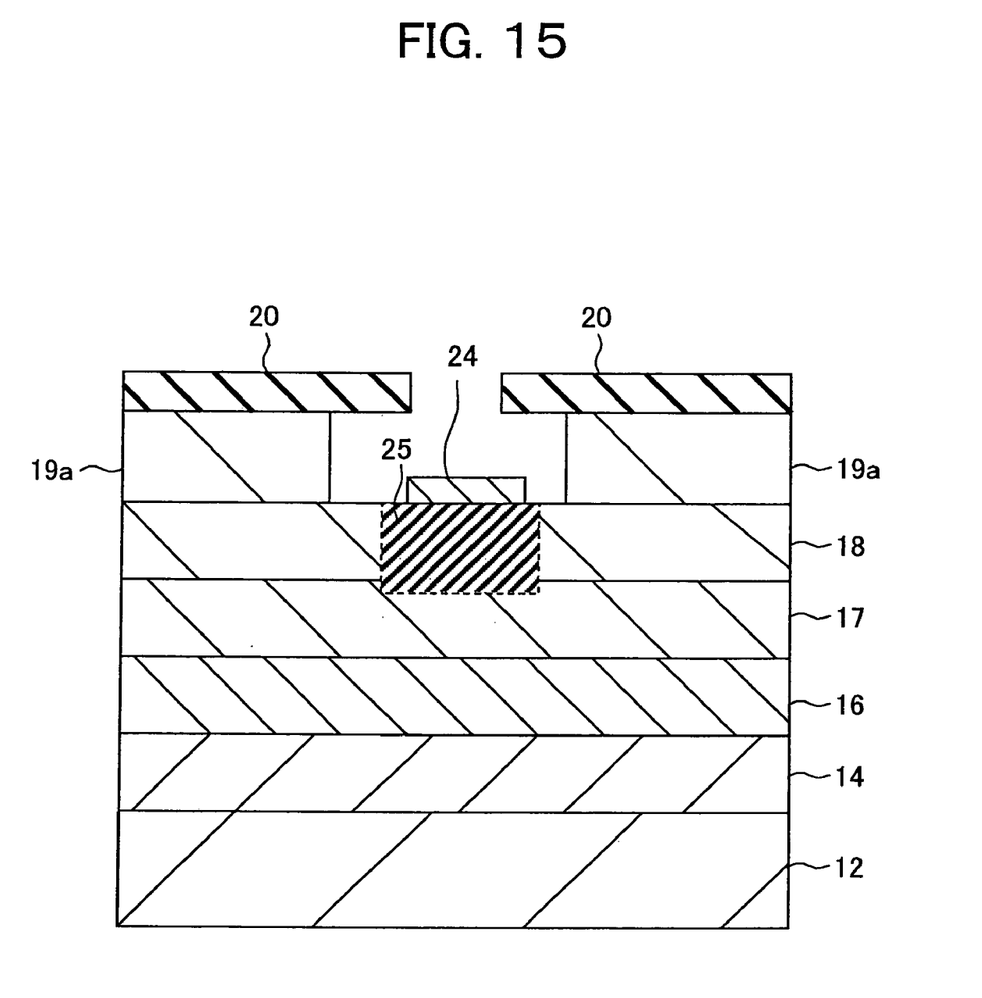
FIG. 15 is a cross-sectional view of an example of the procedure of a method of producing the semiconductor device according to the third embodiment.

FIG. 13 to FIG. 15 are cross-sectional views of an example of the procedure of the method of producing a semiconductor device according to the present embodiment. Note that the method of producing a semiconductor device according to the present embodiment is the same as the method of producing a semiconductor device according to the first embodiment up to FIG. 4 to FIG. 6, so the different parts will mainly be explained.

First, a GaAs substrate 12 is formed with a buffer layer 14, while the buffer layer 14 is formed with a channel layer 16 for forming a channel. Next, the channel layer 16 is formed with a GaAs layer 17 as the diffusion stop layer, while the GaAs layer 17 is formed with an InGaP layer 18 as the diffusion layer.

After forming the InGaP layer 18, the InGaP layer 18 of the diffusion stop layer shown in FIG. 13 is formed with, for example, the n-type GaAs layer 19a. Next, the GaAs layer 19a is formed with a SiN film 20. The SiN film 20 is removed at the part for forming the gate of the FET (field effect transistor) by reactive ion etching (RIE). Next, at the GaAs layer 19a exposed from the aperture formed at the SiN film 20, for example, the p-type impurity Zn is selectively diffused at a temperature of about 600° C. In this case, since the surface is the GaAs layer, pressure of As of a high vapor pressure is applied.

If causing Zn to diffuse for a predetermined time, the Zn passes though the GaAs layer 19a to reach the InGaP layer 18 with a diffusion rate faster than the diffusion stop layer. Since the Zn diffuses fast in the InGaP layer 18, the diffusion appears to stop when reaching the GaAs layer 17 of the diffusion stop layer. Therefore, according to the method of producing a semiconductor device, the diffusion depth of Zn can be controlled by a thickness equal to control of the thickness by the epitaxial growth.

Next, as shown in FIG. 14, the exposed GaAs layer 19a is etched to form an aperture.

Next, as shown in FIG. 15, metal for forming the gate of the FET is deposited in the aperture. As an ohmic electrode, the InGaP layer 18 is formed with, for example, AlGeNi to form the gate electrode 24. By these steps, the semiconductor device 1b of the structure shown in FIG. 12 is formed.

According to the present embodiment, it is possible to exhibit effects substantially the same as the first embodiment. In addition, if using control of the diffusion depth of Zn to form the gate of the FET, the threshold voltage can be controlled more accurately.

The present invention is not limited to the above embodiments.

For example, in the above embodiments, the p-type impurity Zn is illustrated as an impurity, but the invention is not limited to this. Similar effects can be obtained even if employing other impurities. Further, materials were illustrated for the layers of the semiconductor device, but the invention is not limited to these and can be suitably changed.

Further, parts of the structures of the above embodiments can be omitted or combined differently than the above. The channel layer 16, for example, may also be made a double doped hetero structure of AlGaAs/InGaAs. Further, it may be an HEMT (high electron mobility transistor) of a single hetero structure of AlGaAs/GaAs. Moreover, the channel layer may be a doped channel structure of n-type InGaAs.

As explained above, according to the present invention, it is possible to provide a semiconductor device able to be made uniform in diffusion depth of the impurity and be given the desired threshold voltage in the doping region formed at the diffusion layer by a single diffusion and able to be improved in yield and a method of producing the same.

Industrial Applicability

The semiconductor device of the present invention can be applied to ICs, LSIs, and other semiconductor devices.

The method of producing a semiconductor device of the present invention can be applied to the step of controlling the threshold voltage to a desired value in the production of ICs, LSIs, and other semiconductor devices.

What is claimed is:

1. A semiconductor device comprising:
a channel layer (16) formed on a substrate (12);
a diffusion stop layer (17) formed on a top surface of said channel layer (16);
a diffusion layer (18) formed on a top surface of said diffusion stop layer (17); and
an evaporation prevention layer (19) formed at least at part of the top of said diffusion layer (18) and preventing evaporation of elements included in said diffusion layer (18) due to heating, and
a doping region (25) formed adjoining said diffusion stop layer (17) at least at part of said diffusion layer (18) and having an impurity diffused in it; wherein
elements included in said diffusion layer are constant in concentration at any position of said substrate, and
said diffusion stop layer (25) has a diffusion rate slower than the diffusion rate of said impurity in said diffusion layer (18) and is formed to a thickness stopping the diffusion of said impurity from said diffusion layer (18).

2. A semiconductor device as set forth in claim 1, wherein said substrate (12) is formed by a Group III–V compound semiconductor.

3. A semiconductor device as set forth in claim 1, wherein said diffusion layer (18) is formed by a layer including an InGaP layer.

4. A semiconductor device as set forth in claim 1, wherein, in said doping region (25), said diffusion stop layer (17) falls in concentration of said impurity the further from said diffusion layer.

5. A semiconductor device as set forth in claim 1, wherein:
said impurity includes Zn, and
said diffusion stop layer (17) is formed by a layer including a GaAs layer.

6. A semiconductor device as set forth in claim 1, wherein:
said impurity includes Zn, and
said diffusion stop layer (17) is formed by a layer including an AlGaAs layer.

7. A semiconductor device as set forth in claim 1, wherein said evaporation prevention layer (19) is formed by a layer including a GaAs layer.

8. A semiconductor device as set forth in claim 1, wherein said evaporation prevention layer (19) is formed by a layer including an AlGaAs layer.

9. A semiconductor device as set forth in claim 1, wherein said diffusion layer (18) is applied to a p-type gate of a field effect transistor.

10. A method of producing a semiconductor device comprising the steps of:
forming a channel layer (16) on a substrate (12);
forming a diffusion stop layer (17) above said channel layer (16);
forming a diffusion layer (18) above said diffusion stop layer (17);
forming an evaporation prevention layer (19) at least at part of the top of said diffusion layer (18) and preventing evaporation of elements included in said diffusion layer (18) due to heating; and
forming a doping region (25) doped by an impurity so as to adjoin said diffusion stop layer (17) at least at part of said diffusion layer (18); wherein
in the step of forming said diffusion stop layer (17), said diffusion stop layer (17) is formed using a material having slower diffusion rate than said diffusion layer (18), and
in the step of forming said doping region (25), diffusion of the impurity is stopped by said diffusion stop layer (17).

11. A method of producing a semiconductor device as set forth in claim 10, wherein said substrate (12) uses a compound semiconductor substrate.

12. A method of producing a semiconductor device as set forth in claim 10, wherein, in the step of forming said doping region (25), the concentration of said impurity of said diffusion stop layer (17) falls the further from said diffusion layer (25) side.

13. A method of producing a semiconductor device as set forth in claim 10, wherein, in the step of forming said diffusion layer (18), said diffusion layer (18) is formed by a layer including an InGaP layer.

14. A method of producing a semiconductor device as set forth in claim 10, wherein,
in the step of forming said diffusion stop layer (18), said diffusion stop layer (18) is formed by a layer including a GaAs layer, and
in the step of forming said doping region (25), said impurity includes Zn.

15. A method of producing a semiconductor device as set forth in claim 10, wherein,
in the step of forming said diffusion stop layer (17), said diffusion stop layer (17) is formed by a layer including a AlGaAs layer, and in the step of forming said doping region (25), said impurity includes Zn.

16. A method of producing a semiconductor device as set forth in claim 10, wherein, in the step of forming said evaporation prevention layer (19), said evaporation prevention layer (19) is formed by a layer including a GaAs layer.

17. A method of producing a semiconductor device as set forth in claim 10, wherein, in the step of forming said evaporation prevention layer (19), said evaporation prevention layer (19) is formed by a layer including an AlGaAs layer.

18. A method of producing a semiconductor device as set forth in claim 10, wherein said diffusion layer (18) is applied to a p-type gate of a field effect transistor.

* * * * *